(12) United States Patent
Tomioka et al.

(10) Patent No.: US 8,400,769 B2
(45) Date of Patent: Mar. 19, 2013

(54) ELECTRONIC APPARATUS

(75) Inventors: Kentaro Tomioka, Sayama (JP);
Takeshi Hongo, Sagamihara (JP);
Yukihiko Hata, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/895,473

(22) Filed: Sep. 30, 2010

(65) Prior Publication Data

US 2011/0075366 A1    Mar. 31, 2011

(30) Foreign Application Priority Data

Sep. 30, 2009    (JP) .................................. 2009-228640

(51) Int. Cl.
*H05K 7/20* (2006.01)
(52) U.S. Cl. ................ 361/695; 361/679.48; 361/679.5; 361/692; 454/184; 415/206; 165/122
(58) Field of Classification Search .................. 361/676, 361/679.46–679.51, 688–697, 701–704, 361/715–720
See application file for complete search history.

(56) References Cited

U.S. PATENT DOCUMENTS

| | | | | |
|---|---|---|---|---|
| 5,526,875 A * | 6/1996 | Lin | ................ | 165/80.3 |
| 5,940,268 A * | 8/1999 | Miyahara et al. | ............. | 361/697 |
| 6,549,404 B1 * | 4/2003 | Kitahara et al. | ............. | 361/695 |
| 8,157,540 B2 * | 4/2012 | Aoki et al. | ..................... | 417/354 |
| 2002/0172008 A1 * | 11/2002 | Michael | ........................ | 361/697 |
| 2004/0105233 A1 * | 6/2004 | Lai | ................................ | 361/695 |
| 2005/0002163 A1 * | 1/2005 | Lopatinsky et al. | .......... | 361/697 |
| 2006/0146493 A1 * | 7/2006 | Wang et al. | .................... | 361/687 |
| 2008/0112130 A1 * | 5/2008 | Nakamura | .................... | 361/687 |

FOREIGN PATENT DOCUMENTS

| | | |
|---|---|---|
| JP | 2000-227823 | 8/2000 |
| JP | 2000-283089 A | 10/2000 |
| JP | 2001-057493 | 2/2001 |
| JP | 2002-368467 A | 12/2002 |
| JP | 2007-172076 A | 7/2007 |
| JP | 2008-112225 | 5/2008 |
| WO | WO 2005/091693 A1 | 9/2005 |

OTHER PUBLICATIONS

Notice of Reasons for Rejection mailed by Japan Patent Office on Apr. 5, 2011 in a corresponding Japanese patent application No. 2011-025008, which is the second divisional patent application claiming priority from JP 2009-228640.

* cited by examiner

*Primary Examiner* — Courtney Smith
(74) *Attorney, Agent, or Firm* — Knobbe, Martens, Olson & Bear, LLP

(57) ABSTRACT

According to one embodiment, an electronic apparatus includes a housing provided with air intake holes, a circuit board contained in the housing, with a heat producing component mounted on the circuit board, a heat sink contained in the housing, and a fan which sends cooling air to the heat sink in the housing, and includes a fan casing and an impeller contained in the fan casing. The fan casing includes a first suction port and a second suction port which face each other with the impeller inserted therebetween, and an exhaust port which faces the heat sink. The first suction port communicates with the air intake holes of the housing. The second suction port comprises an open area which faces the heat producing component in the housing, and another open area which is open to inside of the housing at a position deviated from the circuit board.

10 Claims, 6 Drawing Sheets

FIG. 2

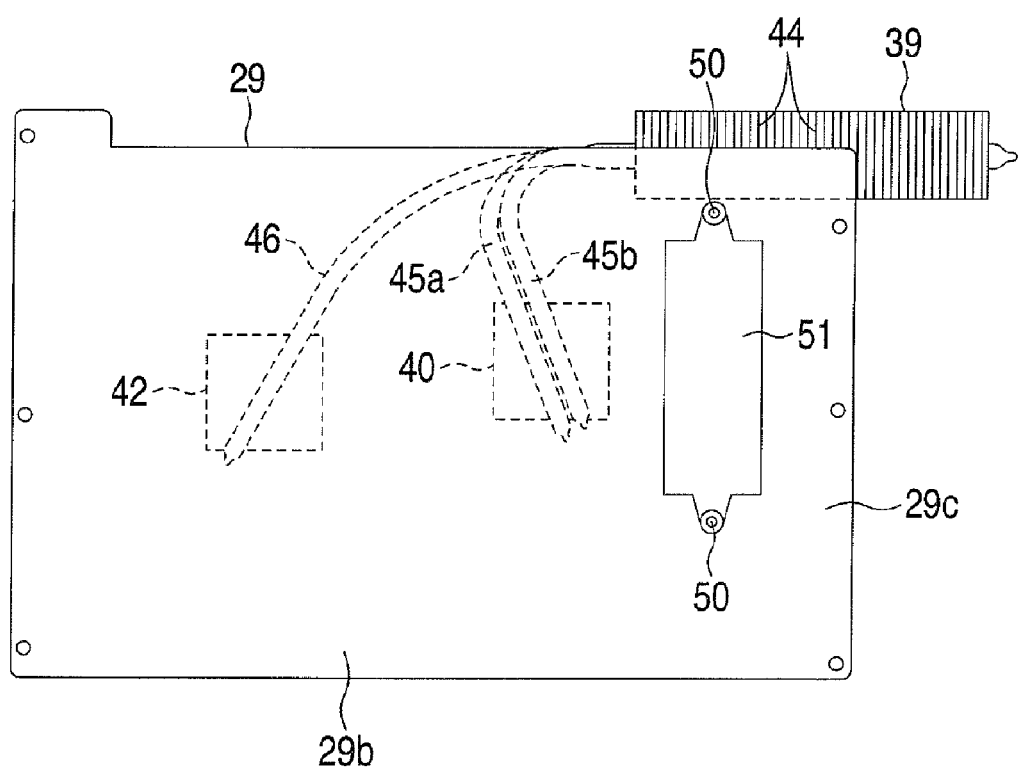
F I G. 3

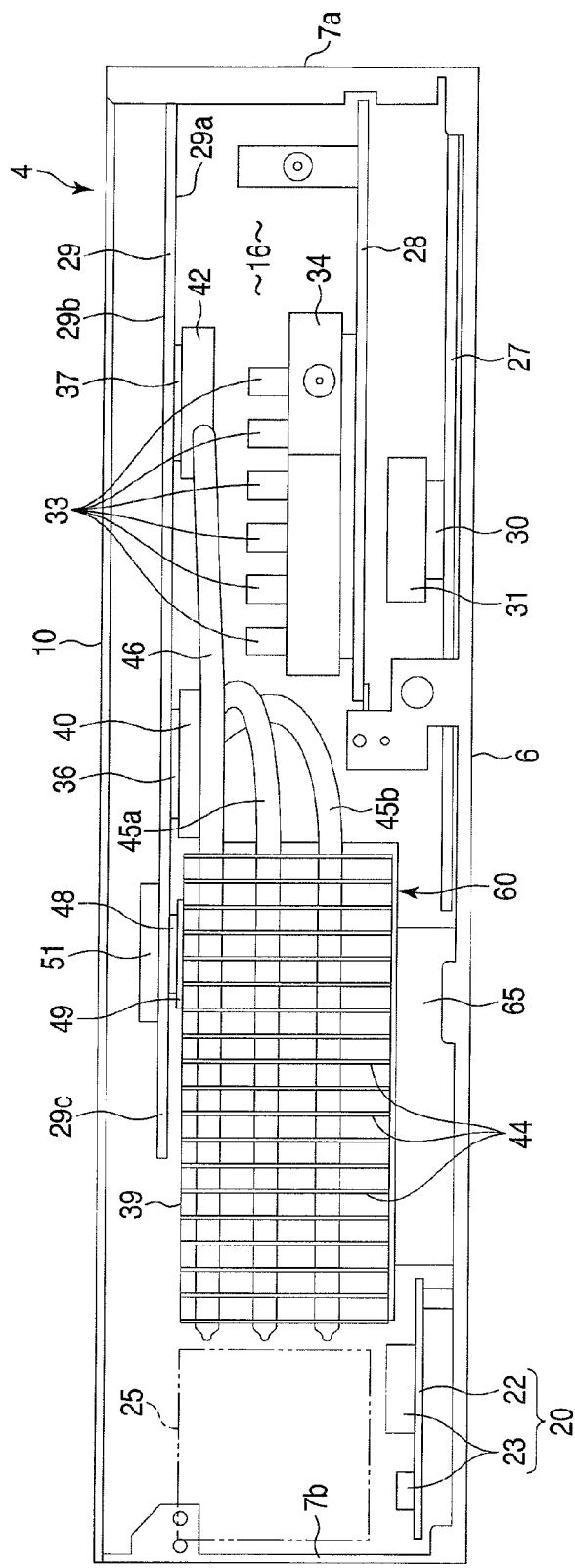
F I G. 5

ELECTRONIC APPARATUS

CROSS-REFERENCE TO RELATED APPLICATIONS

This application is based upon and claims the benefit of priority from Japanese Patent Application No. 2009-228640, filed Sep. 30, 2009; the entire contents of which are incorporated herein by reference.

FIELD

Embodiments described herein relate generally to an electronic apparatus comprising a circuit board provided with a heat producing component.

BACKGROUND

There is a known recording device which is used, connected a television set, for example, when a plurality of television programs are recorded simultaneously or when a long program is recorded. This type of recording device comprises a box-type housing. A plurality of storage devices and a circuit board which controls the storage devices are contained in the housing. The circuit board comprises, for example, a plurality of circuit components such as a semiconductor package and chip components. Particular circuit components which consume much electric power inevitably increase the heat produced. Therefore, conventionally, such cool particular circuit components are subjected to forced cooling by using a fan.

For example, according to the electronic apparatus disclosed in Jpn. Pat. Appin. KOKAI Publication No. 2001-57493, a fan is provided on a printed circuit board where circuit components which produce heat are mounted. The fan comprises a casing and an impeller. The casing has a flat box-type shape and comprises a bottom plate, a top plate, and side plates. The casing comprises a bearing tube which protrudes from the bottom plate to the top plate. The impeller, together with a motor, is supported by the bearing tube and is contained inside the casing.

The bottom plate and top plate of the housing each are provided with air intake holes which draw air from inside the housing. The air intake holes in the bottom plate are open to an air intake space formed between the bottom plate and the printed circuit board, and are positioned immediately above a circuit component which produces heat. The air intake hole in the top plate is open in a space at an upper part in the housing. As the impeller rotates, air in the housing is drawn into the casing from the air intake holes in the top and bottom plates. The drawn air is discharged to outside of the housing from an exhaust port formed in a side plate of the casing.

In the electronic apparatus disclosed in the foregoing publication, heat from the circuit component is discharged into the air intake space between the bottom plate of the casing and the printed circuit board. Therefore, a temperature of the air intake space increases. Since the air intake holes formed in the bottom plate of the casing are open to the air intake space, heated air discharged from the circuit component into the air intake space is further drawn along an air flow into air intake holes of the fan. As a result, no heat from the circuit component stays in a space between the printed circuit board and the fan.

In the electronic apparatus disclosed in the foregoing publication, an entire open area covering the air intake holes formed in the bottom plate of the casing faces the printed circuit board. According to such a configuration, the air intake holes in the bottom plate can draw air only from the air intake space positioned between the bottom plate and the printed circuit board. The air intake space tends to be narrower and narrower as thinning of the housing. Therefore, the fan cannot avoid great resistance from occurring when air is drawn from the air intake space.

As a result, regardless of that the fan draws air in two directions from the bottom and top plates of the casing, heat from the circuit component which tends to stay in the space between the bottom plate and the printed circuit board of the casing. Such heat from the circuit component is difficult to take in efficiently. Accordingly, a temperature in the periphery of the circuit component increases and hinders thermal radiation performance of the circuit component.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 2 is an exemplary cross-sectional view schematically illustrating an interior structure of the television connector according to the embodiment;

FIG. 3 is an exemplary plan view of a fourth circuit board comprising first and second heat receiver blocks thermally connected to a heat sink;

FIG. 5 is an exemplary back view of the television connector, schematically illustrating a positional relationship between first to fourth circuit boards, the heat sink, and an exhaust fan, which are contained in the housing.

DETAILED DESCRIPTION

Various embodiments will be described hereinafter with reference to the accompanying drawings. In general, according to one embodiment, an electronic apparatus includes: a housing provided with air intake holes; a circuit board contained in the housing and provided with a heat producing component; a heat sink contained in the housing; and a fan which sends cooling air to the heat sink within the housing.

The fan comprises a fan casing and an impeller contained in the casing. The fan casing comprises first and second suction ports, and an exhaust port. The first and second suction ports face each other with the impeller intervening therebetween. The exhaust port is opened in a direction different from opening directions of the first and second suction ports, and faces the heat sink. The first suction port communicates with air intake holes in the housing, and the second suction port comprises an open area facing the heat producing component in the housing, and another open area opened in the housing at a position deviated from the circuit board.

Figure 1:
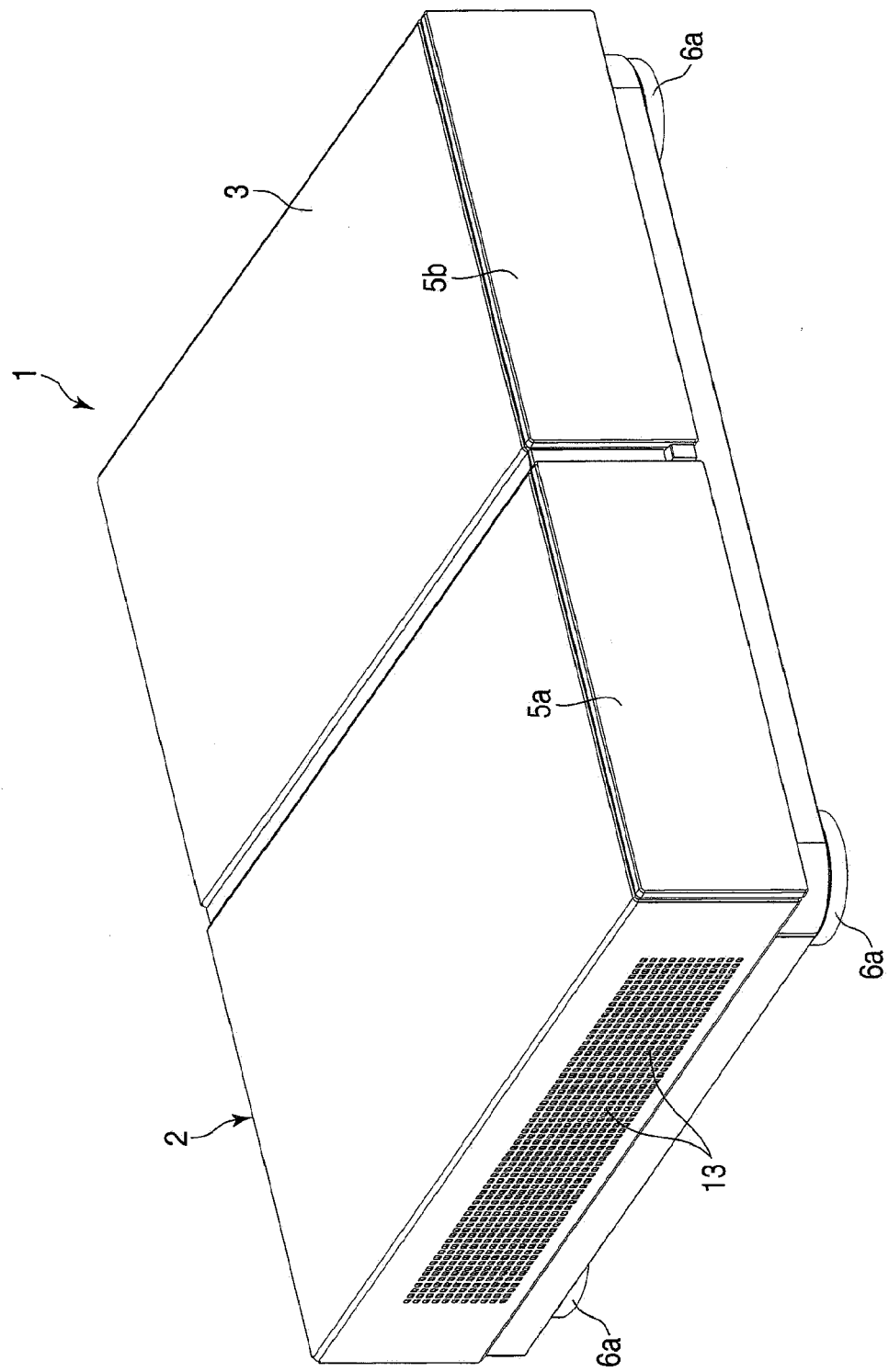
FIG. 1 is an exemplary perspective view of a television connector according to an embodiment.

FIG. 1 illustrates a television connector 1 as an example of the electronic apparatus. The television connector 1 is used connected to a liquid crystal television set. For example, the television connector 1 has functions to receive various television programs, record a plurality of television programs simultaneously, and record long programs.

The television connector 1 comprises a flat box-type main body 2. The main body 2 comprises a housing 4 made of metal and covered with a decorative cover 3, and left and right front doors 5a and 5b covering a front surface of the decorative cover 3.

Figure 2:
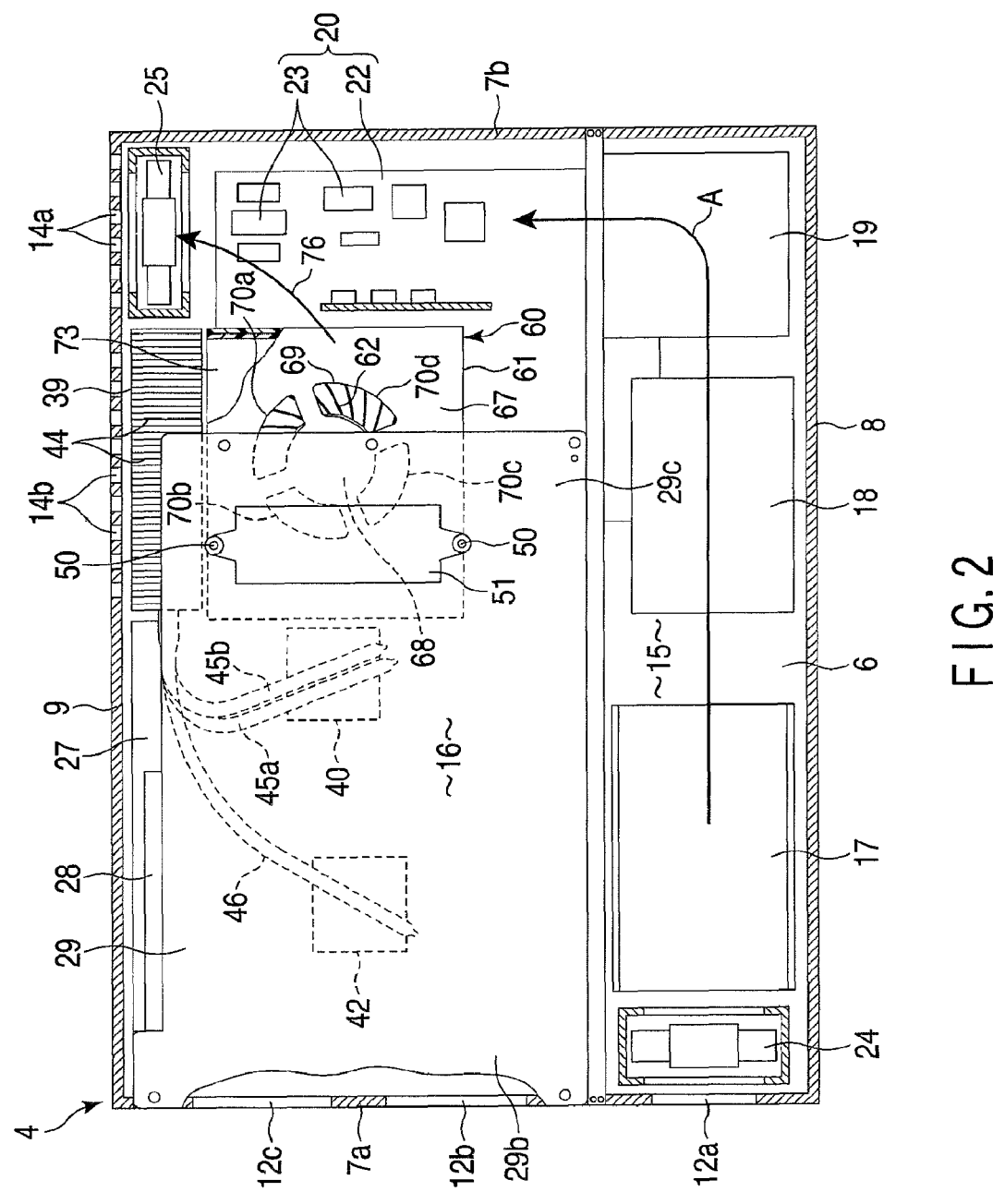
Figure 6:
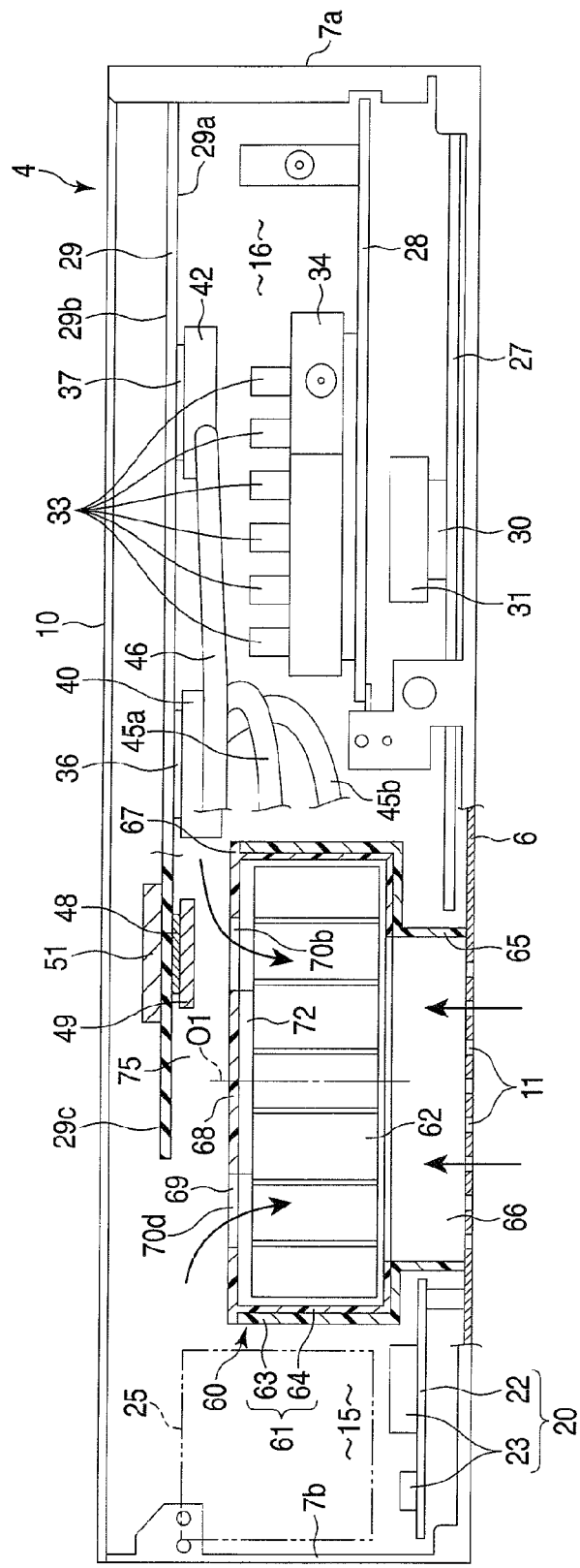
FIG. 6 is an exemplary cross-sectional view of the television connector, schematically illustrating a positional relationship between a fan and the heat radiation plate attached to the fourth circuit board, which are contained in the housing.

As illustrated in FIGS. 2, 5, and 6, the housing 4 forms a frame of the main body 2, and comprises a bottom plate 6, a left side plate 7a, a right side plate 7b, a front plate 8, a back plate 9, and a top plate 10. The bottom plate 6 has a rectangular shape having four corners to which legs 6a are attached to be set on, for example, a television set table. Further, a plurality of air intake holes 11 are formed at a center part of a rear half of the bottom plate 6.

The side plates 7a and 7b, front plate 8, and back plate 9 stand on circumferential edges of the bottom plate 6. The left side plate 7a comprises first to third suction ports 12a, 12b, and 12c. The first to third suction ports 12a, 12b, and 12c are arranged in line at intervals maintained between each other in a depth direction of the housing 4, and communicate with outside of the main body 2 through a plurality of through-holes 13 provided in the decorative cover 3.

In the right half area of the back plate 9, there are provided a plurality of first air exhaust holes 14a and a plurality of second air exhaust holes 14b. Further, the top plate 10 is assembled so as to bridge upper edges of the left side plate 7a, right side plate 7b, front plate 8, and back plate 9, and faces the bottom plate 6.

As illustrated in FIG. 2, the housing 4 comprises a first container area 15 and a second container area 16. The first container area 15 comprises a front half which extends in width direction of the housing 4 along the front plate 8 of the housing 4, and a rear half which extends in a depth direction of the housing 4 along the right side plate 7b of the housing 4. The first suction port 12a of the left side plate 7a communicates with a left end of the front half of the first container area 15. The first air exhaust holes 14a in the back plate 9 communicate with a rear end of the rear half of the first container area 15.

The second container area 16 is surrounded by the left side plate 7a and back plate 9 of the housing 4, and is positioned behind the first container area 15. The air intake holes 11 in the bottom plate 6 communicate with a right end of the second container area 16. The second and third suction ports 12b and 12c communicate with a left end of the second container area 16.

As illustrated in FIG. 2, a first information storage module 17, a second information storage module 18, a card connection device 19, and a power supply module 20 are contained in the first container area 15 in the housing 4. The first and second information storage modules 17 and 18 are to record television programs and to rapidly search for and play back recorded television programs. The first information storage module 17 comprises, for example, two 5-inch hard disc drive devices. The second information storage module 18 comprises, for example, two 3.5-inch hard disc drive devices.

The card connection device 19 comprises, for example, six card slots into which six B-CAS cards are inserted to receive terrestrial digital/BS digital broadcasts. The first information storage module 17, second information storage module 18, and card connection device 19 are positioned in the front half of the first container area 15, and are arranged in line in width directions of the housing 4.

The power supply module 20 comprises a first circuit board 22 as a power supply board. The first circuit board 22 is fixed to a right end of the bottom plate 6 of the housing 4. The first circuit board 22 mounts a plurality of circuit components 23 which constitute a power supply circuit. The circuit components 23 include circuit components which produce heat during operation. The first circuit components 23 are positioned in the rear half of the first container area 15.

A first axial flow fan 24 is provided at a left of the front half of the first container area 15. The first axial flow fan 24 is to forcedly take in air from outside of the housing 4 into the first container area 15, and faces the first suction port 12a.

A second axial flow fan 25 is provided at a rear end of the rear half of the first container area 15. The second axial flow fan 25 is an example of an exhaust fan which is forced to exhaust air from the first container area 15 to outside of the housing 4. The second axial flow fan 25 faces the first air exhaust holes 14a.

When the first axial flow fan 24 and second axial flow fan 25 are driven, air outside the housing 4 is then drawn in through the first suction port 12a into the front half of the first container area 15. Accordingly, air from the rear half of the first container area 15 is drawn out of the housing 4 through the first air exhaust holes 14a.

As a result, as denoted by an arrow A in FIG. 2, an air flow is produced toward the rear half of the first container area 15 from the front half thereof. This air flow forcedly cools the first information storage module 17, second information storage module 18, card connection device 19, and power supply module 20.

The power supply module 20 produces more heat than the first information storage module 17, second information storage module 18, and card connection device 19. However, the power supply module 20 is positioned at a downstream end along an air flow direction in relation to the first container area 15. Therefore, even when the power supply module 20 produces such a greater amount of heat, the first information storage module 17, second information storage module 18, and card connection device 19 are hardly influenced by the heat of the power supply module 20.

As illustrated in FIGS. 5 and 6, second to fourth circuit boards 27, 28, and 29 are contained in the second container area 16 in the housing 4. The second to fourth circuit boards 27, 28, and 29 are layered at intervals maintained between each other in thickness directions of the housing 4.

The second circuit board 27 is an image processing board and is supported horizontally on the bottom plate 6 of the housing 4. A chip component 30 for processing images is mounted on the second circuit board 27. The chip component 30 comprises a heat sink 31.

The third circuit board 28 is a tuner board which is horizontally supported on the second circuit board 27 by a bracket. Six tuner modules 33 for receiving television signals, and a distributer 34 connected to the tuner modules 33 are mounted on the third circuit board 28.

The fourth circuit board 29 is a main board which is horizontally supported on the third circuit board 28 by a bracket. The fourth circuit board 29 comprises a first surface 29a and a second surface 29b. The first surface 29a faces the third circuit board 28. The second surface 29b is in a side opposite to the first surface 29a, and faces the top plate 10 of the housing 4. A high-performance processor 36 and an I/O controller 37 are mounted on the first surface 29a.

The high-performance processor 36 and I/O controller 37 are respectively examples of heating elements. In the embodiment, heat produced by the high-performance processor 36 and I/O controller 37 is transferred to a heat sink 39 and forcedly radiated to outside of the housing 4 from the heat sink 39.

Figure 4:
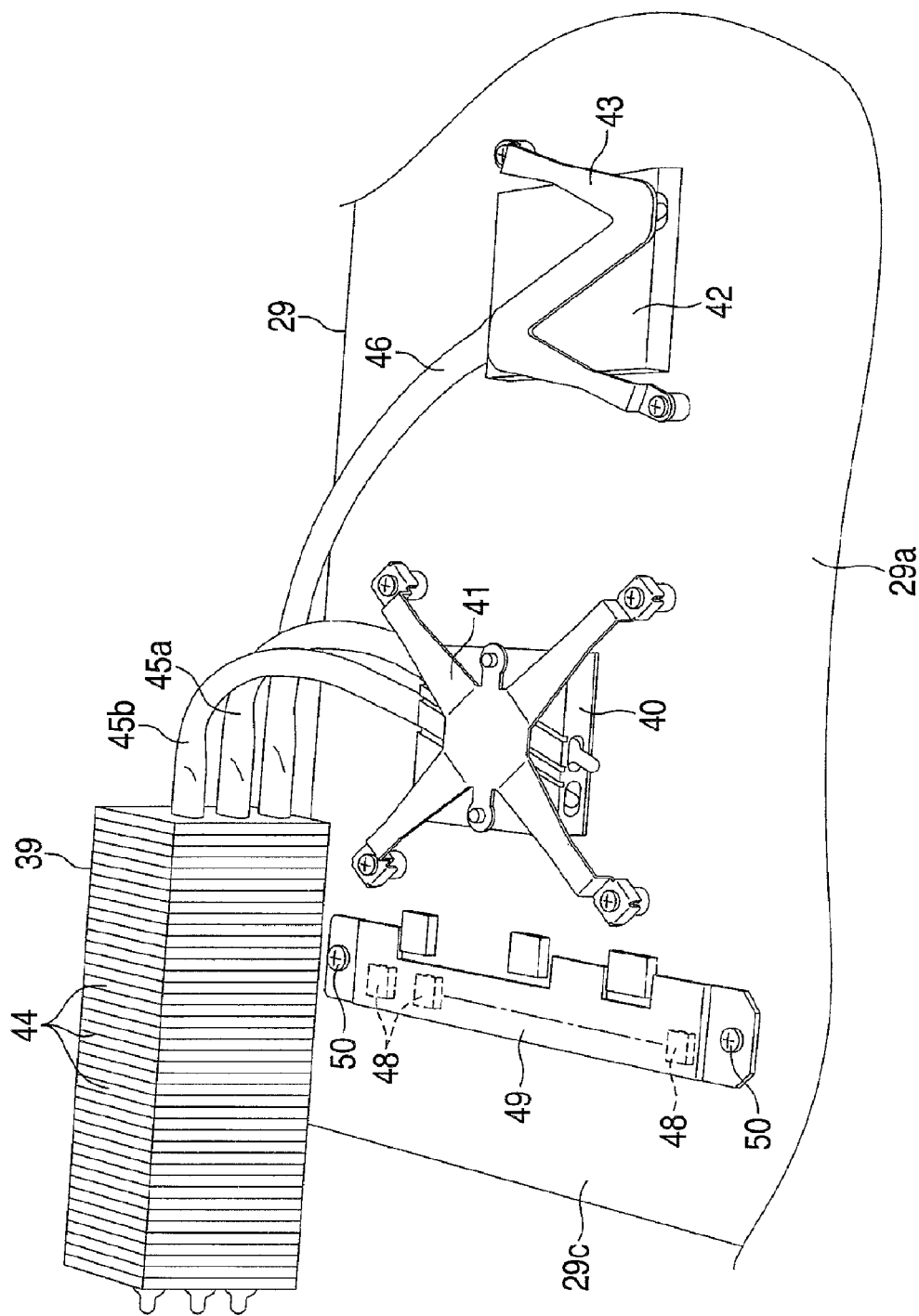
FIG. 4 is an exemplary perspective view of the fourth circuit board comprising first and second heat receiver blocks thermally connected to the heat sink and a heat radiation plate thermally connected to FETs.

More specifically, as illustrated in FIGS. 4 to 6, a first heat receiver block 40 is thermally connected to the high-performance processor 36. The first heat receiver block 40 is made of a metal material which has excellent thermal conductivity such as copper, for example. The first heat receiver block 40 is held on the first surface 29a of the fourth circuit board 29 by a cross-shaped press spring 41. The press spring 41 presses the first heat receiver block 40 against the high-performance processor 36 at a predetermined pressure.

A second heat receiver block 42 is thermally connected to the I/O controller 37. The second heat receiver block 42 is made of a metal material which has excellent thermal conductivity such as copper, for example. The second heat receiver block 42 is held on the first surface 29a of the fourth circuit board 29 by an N-shaped press spring 43. The press spring 43 presses the second heat receiver block 42 against the I/O controller 37 at a predetermined pressure.

The heat sink 39 comprises a plurality of heat radiation fins 44. The heat radiation fins 44 are arranged parallel to each other. Two heat pipes 45a and 45b are bridged between the heat sink 39 and the first heat receiver block 40. One end of each of the heat pipes 45a and 45b is fixed to the first heat receiver block 40, for example, by means of caulking, and is thermally connected to the first heat receiver block 40. The other end of each of the heat pipes 45a and 45b penetrates sequentially the heat radiation fins 44, and is thermally connected to the heat radiation fins 44. Therefore, heat produced by the high-performance processor 36 is transferred to the first heat receiver block 40, and is thereafter transferred from the first heat receiver block 40 to the heat sink 39 through the heat pipes 45a and 45b.

One heat pipe 46 is bridged between the heat sink 39 and the second heat receiver block 42. One end of the heat pipe 46 is fixed to the second heat receiver block 42, for example, by means of caulking, and is thermally connected to the second heat receiver block 42. The other end of the heat pipe 46 penetrates sequentially the heat radiation fins 44 and is thermally connected to the heat radiation fins 44. Therefore, heat produced by the I/O controller 37 is transferred to the second heat receiver block 42, and is thereafter transferred from the second heat receiver block 42 to the heat sink 39 through the heat pipe 46.

Further, three heat pipes 45a, 45b, and 46 hold the heat sink 39 onto a rear end of the first surface 29a of the fourth circuit board 29. Therefore, when the fourth circuit board 29 is horizontally supported on the third circuit board 28, the heat sink 39 is contained in a rear end of the second mount area 16 in the housing 4, and faces the second air exhaust holes 14b of the housing 4.

As illustrated in FIG. 6, the fourth circuit board 29 comprises an overhang part 29c which extends more in a direction to the first circuit board 22 than the second circuit board 27 and third circuit board 28. A plurality of field-effect transistors (FETs) 48 are mounted on a lower surface of the overhang part 29c of the fourth circuit board 29. The FETs 48 are an example of circuit components which produce heat, and are arranged in line in the depth direction of the housing 4, at a position where the FETs 48 are adjacent to the first heat receiver block 40.

A heat radiation plate 49 is attached to the lower surface of the overhang part 29c of the fourth circuit board 29. The heat radiation plate 49 is made of a metal material which has excellent thermal conductivity such as aluminum, for example. The heat radiation plate 49 is shaped like a long and narrow plate which extends in a direction in which the FETs 48 are arrayed. Ends of the heat radiation plate 49 in the length direction thereof are fixed to the fourth circuit board 29 by screws 50, respectively. In this manner, the heat radiation plate 49 is thermally connected to the FETs 48, covering the FETs 48 from downside, and radiates heat produced by the FETs 48 into the housing 4.

As illustrated in FIGS. 3 and 6, a back plate 51 is provided on an upper surface of the overhang part 29c of the fourth circuit board 29. The back plate 51 is made of a metal material which has excellent thermal conductivity such as aluminum, for example. The back plate 51 is fixed to the fourth circuit board 29 by the screws 50. Therefore, the back plate 51 cooperates with the heat radiation plate 49 thereby to sandwich the fourth circuit board 29. In this manner, the back plate 51 reinforces an installation part where the heat radiation plate 49 is attached, from upside of the fourth circuit board 29.

Further, the back plate 51 is thermally connected to the fourth circuit board 29 just in a back side of FETs 48. Therefore, the heat produced by the FETs 48 partially transfers indirectly to the back plate 51 through the fourth circuit board 29.

As a result, the back plate 51 positioned above the fourth circuit board 29 also functions as a heat radiation part which indirectly radiates the heat from the FETs 48. Existence of the back plate 51 reduces the heat transferred to the heat radiation plate 49, and accordingly suppresses increase in temperature of the heat radiation plate 49.

As illustrated in FIGS. 2 and 6, a fan 60 is provided in the second container area 16 of the housing 4. The fan 60 is to send cooling air to the heat sink 39, and is inserted between the bottom plate 6 of the housing 4 and the overhang part 29c of the fourth circuit board 29. The fan 60 comprises a fan casing 61 and an impeller 62. The fan casing 61 comprises an outer casing 63 and an inner casing 64. The outer casing 63 is shaped like a rectangular box which is open to upside and the back side of the housing 4.

A cylindrical duct part 65 is formed in the bottom of the outer casing 63. The duct part 65 is protruded from the bottom of the outer casing 63 toward the bottom plate 6 of the housing 4. A protruding end of the duct part 65 is fixed to the bottom plate 6 by a plurality of screws. Further, the duct part 65 surrounds an area of the bottom plate 6 where the air intake holes 11 are opened. Therefore, the duct part 65 constitutes a first suction port 66 which communicates with outside of the housing 4 through the air intake holes 11.

The inner casing 64 is engaged in the outer casing 63. The inner casing 64 comprises a top plate 67. The top plate 67 is attached to an upper end of the outer casing 63 so as to cover the outer casing 63. The top plate 67 comprises an impeller assembly part 68 and a second suction port 69.

As illustrated in FIG. 2, the impeller assembly part 68 is positioned at the center of the top plate 67. The second suction port 69 comprises first to fourth open areas 70a, 70b, 70c, and 70d. The first to fourth open areas 70a, 70b, 70c, and 70d each have a shape of an opening like a circular arc, and surround the impeller assembly part 68. Therefore, the first to fourth open areas 70a, 70b, 70c, and 70d are arranged at intervals maintained between each other, along a circumference of one circle about the impeller assembly part 68 as a center.

As illustrated in FIG. 6, the impeller 62 is supported on a lower surface of the impeller assembly part 68 by a flat motor 72. The impeller 62 is inserted between the bottom of the outer casing 63 and the top plate 67 of the inner casing 64, with a rotation axis line 01 arranged vertically. Therefore, the first suction port 66 and second suction port 69 face each other with the impeller 62 inserted therebetween, and are open in an axial direction of the rotation axis 01 of the impeller 62.

As illustrated in FIG. 2, a rear edge of the top plate 67 of the fan casing 61 cooperates with a rear end opening part of the outer casing 63, thereby forming an exhaust port 73. The exhaust port 73 is open to the back side of the housing 4 so as to be perpendicular to open directions of the first suction port 66 and second suction port 69, and face to the heat sink 39.

When the impeller 62 is driven by the flat motor 72, air outside the housing 4 is drawn into a part of rotation center of the impeller 62 through the air intake holes 11 and the first suction port 66, as denoted by an arrow in FIG. 6. Accordingly, air inside the housing 4 is drawn into the part of the rotation center of the impeller 62 from the first to fourth open areas 70a, 70b, 70c, and 70d of the second suction port 69.

As illustrated in FIGS. 2 and 6, substantial half of the fan 60 is under the overhang part 29c of the fourth circuit board 29. According to the embodiment, in the second suction port 69 of the fan 60, half of the first open area 70a, the second open area 70b, and the third open area 70c are open to a gap 75 between the overhang part 29c of the fourth circuit board 29 and the top plate 64 of the fan casing 61.

The heat radiation plate 49 thermally connected to the FETs 48 faces the gap 75, and faces most of the second open area 70b and a part of the third open area 70c in the gap 75.

In the second suction port 69 of the fan 60, remaining half of the first open area 70a and most of the fourth open area 70d are open to inside of the housing 4, at a position deviated from the overhang part 29c of the fourth circuit board 29. In other words, the remaining half of the first open area 70a and most of the fourth open area 70d are not open to the gap 75 but face the top plate 10 of the housing 4.

Further, the fan 60 is adjacent to the second axial flow fan 25. When the second axial flow fan 25 operates, air inside the housing 4 is then drawn into the second axial flow fan 25. Therefore, as denoted by an arrow in FIG. 2, a flow channel 76 toward the second axial flow fan 25 is formed inside the housing 4.

According to the embodiment, in the second suction port 69 of the fan 60, half of the first open area 70a positioned out of the fourth circuit board 29, and most of the fourth open area 70d are positioned on the flow channel 76, and suction air flowing through the flow channel 76.

According to the television connector 1 configured as described above, the FETs 48 mounted on the fourth circuit board 29 produce heat during operation. Most of the heat produced by the FETs 48 directly transfers to the heat radiation plate 49, and is radiated into the gap 75 between the fourth circuit board 29 and the top plate 67 of the fan casing 61. The remaining heat produced by the FETs 48 transfers through the fourth circuit board 29 to the back plate 51, and is radiated into the housing 4 from the back plate 51.

When the first and second axial flow fans 24 and 25 operate during use of the television connector 1, air outside the housing 4 is drawn into the first container area 15 from the first suction port 12a. Further, air in rear half of the first container area 15 is drawn to outside of the housing 4 through the first air exhaust holes 14a, and the flow channel 76 where air flows toward the second axial flow fan 25 is formed in the housing 4.

When the fan 60 operates during use of the television connector 1, air outside the housing 4 is drawn into the part of rotation center of the impeller 62 through the first suction port 66 of the fan casing 61 from the air intake holes 11. Accordingly, air in the gap 75 is drawn from the first to third open areas 70a, 70b, and 70c into the part of rotation center of the impeller 62 because, in the second suction port 69 of the fan casing 61, half of the first open area 70a, the second open area 70b, and the third open area 70c are open to the gap 75 in the housing 4. In this manner, an air flow toward the second suction port 69 is formed at the portion of the gap 75.

Air drawn into the part of rotation center of the impeller 62 is discharged into the fan casing 61 from an outer peripheral part of the impeller 62, and is thereafter blown to the heat sink 31 through the exhaust port 73 of the fan casing 61. As a result, heat from the high-performance processor 36 and I/O controller 37, which has been transferred to the heat sink 31, is discharged to outside of the housing 4 by an air flow which passes through the heat sink 31.

According to the embodiment, heat from the FETs 48 radiated from the heat radiation plate 49 to the gap 75 is drawn into the first to third open areas 70a, 70b, and 70c of the second suction port 69 by an air flow produced at the portion of the gap 75.

Accordingly, most of the second open area 70b and a part of the third open area 70c face the heat radiation plate 49 in the gap 75. Therefore, heat from the FETs 48 radiated from the heat radiation plate 49, together with air, is taken into the fan casing 61 from the second and third open areas 70b and 70c before the heat is diffused into the gap 75.

Further, half of the first open area 70a and the fourth open area 70d of the second suction port 69 are open to inside of the housing 4, at a position out of the gap 75, and is positioned on the flow channel 76 where air flows toward the second axial flow fan 25.

Therefore, the second suction port 69 can forcefully take in not only air inside the gap 75 but also air which flows through the flow channel 76 produced in the housing 4. Accordingly, no large resistance occurs when the second suction port 69 draws air.

As a result, excellent air permeability is obtained inside the gap 75 and housing 4, and hot air convected from the heat radiation plate 49 can avoided from staying in the gap 75. Therefore, thermal radiation performance of the FETs 48 can be improved, and excessive heating and operation errors of the FETs 48 can be securely prevented.

In the above embodiment, the heat radiation plate thermally connected to the FETs is configured to face the second and third open areas of the second suction port. However, the embodiment is not limited to this configuration. For example, the heat radiation plate may be omitted such that the FETs are directly exposed to the gap and face the second and third open areas of the second suction port.

Further, the circuit components which produce heat are not limited to FETs but may be other circuit components such as a semiconductor package, for example.

In addition, the electronic device according to the embodiment is not limited to a television connector but the embodiment is applicable to other devices such as a personal computer and a server, for example.

While certain embodiments have been described, these embodiments have been presented by way of example only, and are not intended to limit the scope of the inventions. Indeed, the novel embodiments described herein may be embodied in a variety of other forms; furthermore various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a housing provided with air intake holes;
a circuit board contained in the housing, with a heat producing component mounted on the circuit board;
a heat sink contained in the housing; and
a fan which sends cooling air to the heat sink, wherein the fan comprises a fan casing and an impeller contained in the fan casing, the fan casing comprising a first suction port and a second suction port with the impeller inserted therebetween, and an exhaust port which is open in a direction different from open directions of the first and second suction ports, the exhaust port facing the heat sink, the first suction port communicates with the air intake holes of the housing, and the second suction port comprises an open area which faces a surface of the circuit board on which the heat producing component of the circuit board is mounted in the housing, and another open area which is open to the inside of the housing at a position deviated from the circuit board.

2. The electronic apparatus of claim 1, further comprising an exhaust fan which forcedly discharges air from inside of the housing to outside of the housing.

3. The electronic apparatus of claim 2, wherein, when the exhaust fan operates, a flow channel where air flows toward the exhaust fan is formed in the housing, and wherein the another open area of the second suction port is positioned on the flow channel.

4. The electronic apparatus of claim 3, further comprising a heat radiation plate thermally connected to the heat producing component, and the open area of the second suction port faces the heat radiation plate.

5. The electronic apparatus of claim 4, wherein the circuit board comprises a first surface where the heat producing component is mounted and a second surface opposite the first surface, wherein
- a back plate made of metal is attached to a position on the second surface corresponding to a back side of the heat producing component, and
- the back plate is thermally connected to the heat producing component through the circuit board.

6. An electronic apparatus comprising:
a housing;
a circuit board contained in the housing;
a circuit component which is mounted on the circuit board and produces heat;
a heating element contained in the housing;
a heat sink which is contained in the housing and radiates heat of the heating element; and
a fan which is contained in the housing and sends cooling air to the heat sink, wherein the fan comprises a fan casing and an impeller contained in the fan casing, the fan casing comprising a suction port which is open in an axial direction of the impeller, and an exhaust port which is open in a direction different from an open direction of the suction port, the exhaust port facing the heat sink, and the suction port comprises a first area which faces a surface of the circuit board on which the circuit component of the circuit board is mounted in the housing, and a second area which is open to the inside of the housing at a position deviated from the circuit board.

7. The electronic apparatus of claim 6, further comprising an exhaust fan which forcedly discharges air from inside of the housing to outside of the housing, and, when the exhaust fan operates, a flow channel where air flows toward the exhaust fan is formed in the housing, and the second area of the suction port is positioned on the flow channel.

8. An electronic apparatus comprising:
a housing;
a circuit board contained in the housing;
a heat producing component mounted on the circuit board; and
a fan which is contained in the housing, wherein
the fan comprises a fan casing and an impeller contained in the fan casing, the fan casing comprising a suction port and an exhaust port which is open in a direction different from a direction in which the suction port is open, and
the suction port comprises an area which faces a surface of the circuit board on which the heat producing component of the circuit board is mounted in the housing, the suction port comprising another area which is open to the inside of the housing at a position deviated from the circuit board.

9. The electronic apparatus of claim 8, further comprising an exhaust fan which forcedly discharges air from inside of the housing to outside of the housing, and, when the exhaust fan operates, a flow channel where air flows toward the exhaust fan is formed in the housing, and the open area of the suction port is positioned on the flow channel.

10. The electronic apparatus of claim 9, wherein the open area of the suction port is open to a gap formed between the circuit board and the fan casing.

* * * * *